United States Patent [19]

Mori et al.

[11] Patent Number: 4,942,454
[45] Date of Patent: Jul. 17, 1990

[54] RESIN SEALED SEMICONDUCTOR DEVICE

[75] Inventors: Ryuichiro Mori; Katsuyuki Fukudome; Tatsuhiko Akiyama; Yoshitaka Takemoto, all of Itami, Japan

[73] Assignee: Mitsubishi Denki Kabushiki Kaisha, Japan

[21] Appl. No.: 227,332

[22] Filed: Aug. 2, 1988

[30] Foreign Application Priority Data

Aug. 5, 1987 [JP] Japan .............................. 62-196853
Jan. 12, 1988 [JP] Japan .................................. 63-2975

[51] Int. Cl.[5] ............................................. H01L 23/48
[52] U.S. Cl. ......................................... 357/70; 357/72
[58] Field of Search ............................... 357/68, 70, 72

[56] References Cited

FOREIGN PATENT DOCUMENTS

| 55-53450 | 4/1980 | Japan. |
| 56-76542 | 6/1981 | Japan. |
| 58-14557 | 1/1983 | Japan. |
| 0014452 | 1/1987 | Japan .................................. 357/70 |

Primary Examiner—James W. Davie
Attorney, Agent, or Firm—Leydig, Voit & Mayer

[57] ABSTRACT

A resin-sealed semiconductor device comprises a die pad which has through holes. Thin metal films are provided on the surfaces of the die pad except for the wall surfaces of the holes. A resin, which is used for integral molding of the die pad and a semiconductor element, flows into the holes during molding. The semiconductor device so mounted does not induce cracks in the resin and, thus, has good moisture resistance.

3 Claims, 3 Drawing Sheets

RESIN SEALED SEMICONDUCTOR DEVICE

BACKGROUND OF THE INVENTION

The present invention relates to a resin-sealed semiconductor device in which a lead frame and semiconductor elements are integrally molded with resin.

FIG. 1 is a plan view of a lead frame which is used in a conventional resin-sealed semiconductor device described in, for example, Japanese Patent Laid-Open No. 14557/1983. A lead frame 1 being formed by punching or etching a raw material has the form of an elongated plate. The lead frame 1 comprises quadrangular frame pieces 2 which are integrally continued, since only part of the lead frame 1 is shown in FIG. 1. Support arms 3 are formed from two opposing sides of each of the frame pieces 2 toward the center thereof so as to support a quadrangular die pad 4. Through holes 5 are provided in the die pad 4. A plurality of leads 6 radially extend from the vicinity of the die pad 4 are connected to each of the frame pieces 2 at right angles. Tie bars 7 are integrally connected to intermediate positions of the leads 6 in order to support these leads 6 and prevent any leakage of resin toward the outside during molding of the resin. After such a form has been formed by punching or etching, plating is performed on one of the surfaces of the die pad 4 and on each of the leads 6 within a region 8 of metal plating for bonding. This improves solderability which aids in bonding a semiconductor element (not shown) to the die pad 4 and the connectability of wires (not shown) to the leads 6 so that a gold or silver metal film for bonding is formed on the surfaces.

FIG. 2 is a sectional view of the process of plating the metal plating region 8 for bonding the lead frame 1. A mask 11, having a window 10 which corresponds to the metal plating region 8 for bonding is placed on the side of an upper principal surface 9 of the lead frame 1, and a pressure member 13 is placed on the side of a lower principal surface 12 thereof. A plating solution is poured from the direction shown by reference numeral 14. At this time, plating is performed on the upper principal surface 9 of the lead frame 1 as well as on the wall surfaces 15 of the through holes 5. Thereby, thin films 16 of a metal such as gold or silver are formed on the upper principal surface 9 and the wall surfaces 15.

FIG. 3 is a sectional side view of a conventional resin-sealed semiconductor device which uses the lead frame 1 shown in FIGS. 1 and 2. In FIG. 3, a semiconductor element 18 in which a metal thin film 17 is formed on the back surface is fixed to the surface of the metal thin film 16 for bonding of the die pad 4 by means of a fixing material such as solder 19. Soldering is conducted by heat-melting the solder 19 and pressing the semiconductor element 18 on the die pad 4.

In other words, the solder 19 is first placed on a central portion of a semiconductor element fixing portion 4a of the die pad 4 as shown in FIGS. 4(a) and 4(b), the semiconductor element 18 is then placed on the solder 19, and a load is downwardly applied to the semiconductor element 18. In this way, the solder 19 is spread out by the semiconductor element 18 and reaches the portions of the through holes 15 at the positions near the outside of the semiconductor element 18 which is thus necessarily and sufficiently fixed to the die pad 4. In particular, such a configuration enables the solder 19 to be spread to an appropriate and sufficient thickness because most of the semiconductor element fixing portion 4a has a flat surface. In FIGS. 4(a) and 4(b) and FIG. 5, the metal thin films 16, 17 are not shown. However, since the metal thin films 16 which are formed on the wall surfaces of the through holes 5 increase the wettability of the through holes 5 by the solder 19, the solder 19 flows into the through holes 5 along the wall surfaces 15 during the soldering and sometimes fills most of the through holes 5.

Electrode terminals (not shown) of the semiconductor element 18 are connected to the leads 6 by wires 20 as shown in FIG. 3. The above-described metal plating region 8 of the lead frame 1, the semiconductor element 18, the metal thin films 16 and the wires 20 are subjected to integral molding using sealing resin 21. After molding, the frame pieces 2 and the die bars 7 are cut away, and the support arms 3 are cut. The leads 6 are bent at the positions at which the leads 6 separate from the resin 21, and the mounting metal thin films 22 are formed on the surfaces of the portions of the leads 6 outside the resin 21.

In this resin-sealed semiconductor device, the semiconductor element 18 and the wires 20 are protected from the external environment by the sealing resin 21. When the device is used, electrical signals are input from the portions of leads 6 which are exposed to air in the outside of the resin 21, pass through the wires 20, enter the semiconductor element 18, again pass through the wires 20 and output from the leads to the outside of the element 18.

Since the conventional resin-sealed semiconductor device is configured as described above, there are differences in the coefficients of linear expansion of the constitutive members and materials. In particular, since the coefficient of linear expansion of the resin 21 is greater than that of each of the other members and materials, stress is generated in each of the members due to the temperature changes produced during molding of the resin and during tests or use thereof after the semiconductor device has been mounted on a printed wiring board. In particular, since stress is concentrated on the corners and the ends of the die pad 4, and separation occurs at the interfaces between the resin 21 and the other members and materials, in some cases, concentrations are stress increased and cracks occur in the resin 21. In addition, there is a problem in that, if the resin 21 absorbs water during the storage of this sort of resin-sealed semiconductor device, cracks are produced at the connection portions between the die pad 4 and the sealing resin 21 in the mold body due to rapid heating during soldering when this semiconductor device is mounted on a printed board. If these cracks are increased, moisture resistance of the semiconductor device deteriorates. This problem is because of the weak adhesive force between the die pad 4 which is formed into a simple plate and the sealing resin 21 which constitutes the mold body in a conventional structure. Thus, separation is easily produced in the connection portions therebetween.

To solve this problem, for example, as shown in Japanese Patent Laid-Open No. 76542/1981, the through holes 5 or notches are provided in the die pad 4 so as to be charged with the sealing resin 21. As a result, stress is dispersed due to the effect of engagement between the die pad 4 and the resin 21, the occurrence of cracks is thus prevented, as well as separation in the connection portions between the die pad 4 and the resin 21 being prevented by increasing the adhesive force therebetween.

However, as shown in FIG. 3, most of the through holes are filled with the solder 19 and thus there are only small spaces into which the resin 21 flows. Therefore, there is a problem in that a sufficient engagement is not obtained and stress is even more concentrated on the corners and the ends of the die pad 4, resulting in the occurrence of cracks in the resin 21.

SUMMARY OF THE INVENTION

The present invention has been achieved with a view to solving the aforementioned problems, and it is an object of the present invention to provide a resin-sealed semiconductor device which can prevent cracks from occurring in resin due to the stress produced by temperature changes during molding, tests and use of the resin-sealed semiconductor device.

The resin-sealed semiconductor device of the present invention comprises a die pad which has through holes with metal thin films provided on the surfaces except for the wall surfaces of the through holes, and a resin used for integral molding of the die pad and a semiconductor element fixed to the die pad.

The present invention also provides a method of producing a resin-sealed semiconductor device comprising the steps of metal-plating a region of bonding metal-plating including a die pad having through holes in a lead frame, processing the lead frame into a given shape, fixing the die pad to a semiconductor element, and integrally sealing with sealing resin at least the lead frame member in the region of bonding metal-plating of the lead frame, the die pad and the semiconductor element.

In the resin-sealed semiconductor device of the present invention, since the wall surfaces of the through holes provided in the die pad of the lead frame used are wet with difficulty by a fixing material, when the semiconductor element is fixed to the metal thin film of the die pad, the fixing material such as solder does not easily flow into the through holes and does not fill the through holes. Therefore, a large amount of the sealing resin is charged in the through holes. Therefore, an effect of engagement is produced between the die pad and the resin and causes stress to disperse, as well as ensuring an adhesive force between the die pad and the resin. In addition, it is possible to prevent cracks from occurring in the resin due to stress produced by temperature changes during molding, tests and use of the resin-sealed semiconductor device and to maintain the sufficient moisture resistance of the semiconductor device.

DESCRIPTION OF PREFERRED EMBODIMENT

Figure 1:
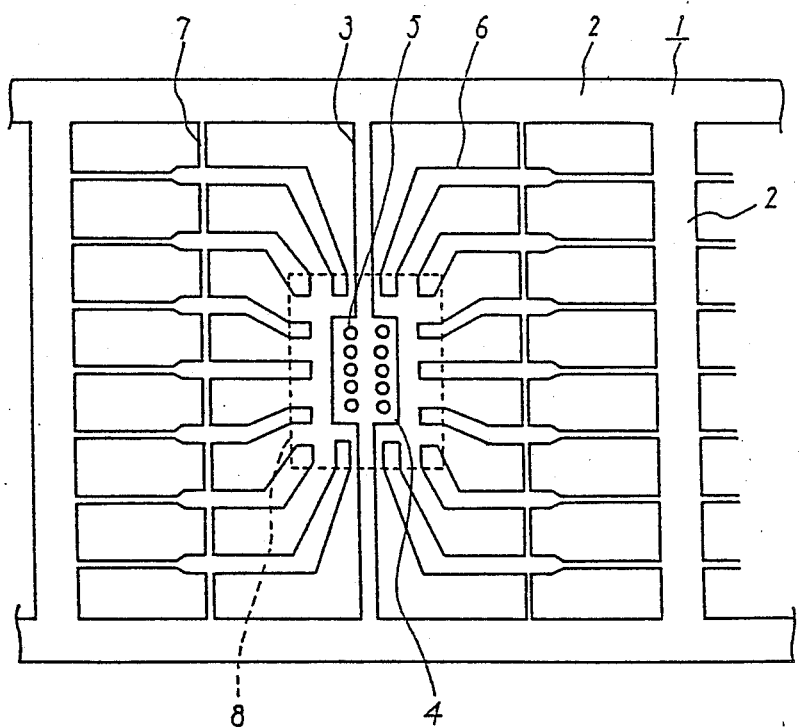
FIG. 1 is a plan view of a lead frame used in a conventional resin-sealed semiconductor device.
Figure 2:
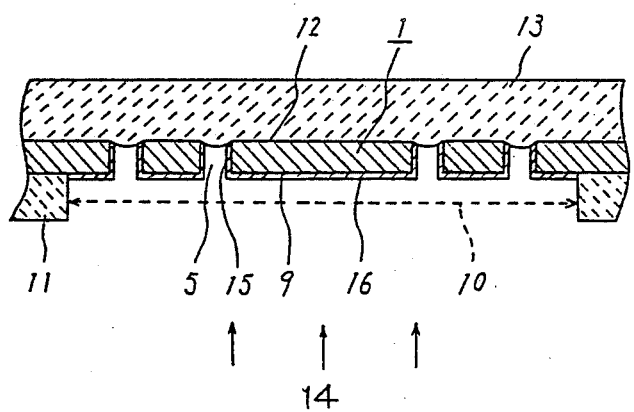
FIG. 2 is a sectional side view of a metal-plating region in a process of plating the lead frame shown in FIG. 1.
Figure 3:
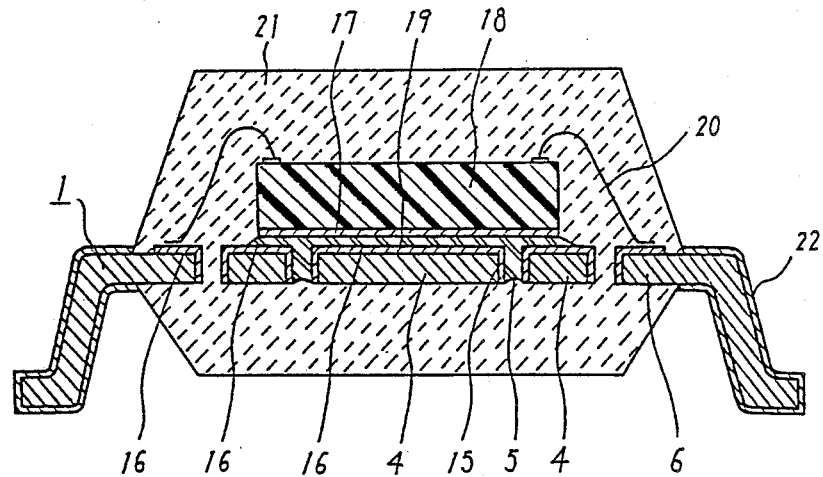
FIG. 3 is a sectional side view of a conventional resin-sealed semiconductor device.
Figure 6:
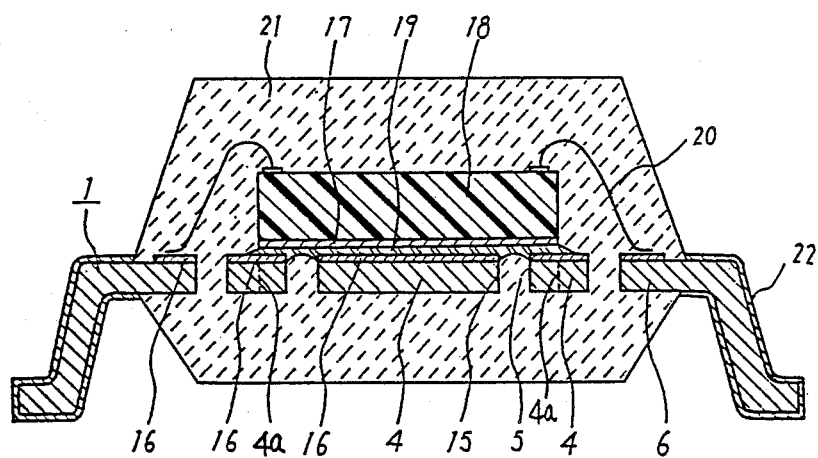
FIG. 6 is a sectional view of a resin-sealed semiconductor device of an embodiment of the present invention.
Figure 4A:
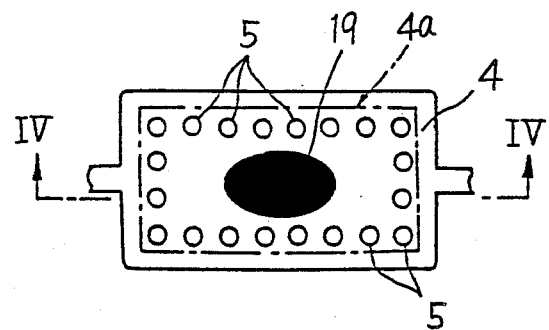
FIG. 4(a) is a schematic plan view of a die pad and FIGS. 4(b) is a sectional view taken along the line IV—IV of FIG. 4(a)
Figure 4B:
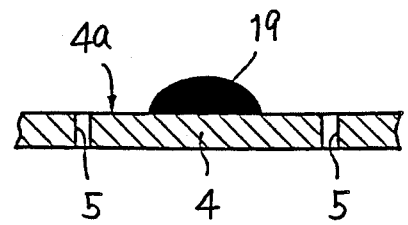
Figure 5:
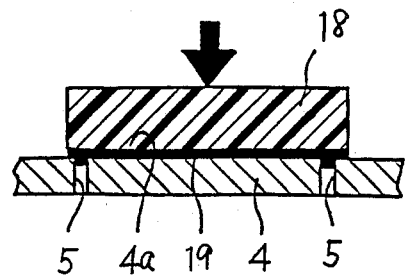
FIG. 5 is a sectional view of a die pad showing a semiconductor device pressed on the die pad.

FIG. 6 is a sectional view of a resin-sealed semiconductor device of an embodiment of the present invention. In FIG. 6, the same reference numerals as those in FIGS. 1 to 5 denote the same members.

The semiconductor device of the present invention comprises the die pad 4 which has the through holes 5 with the metal thin films 16 provided thereon except for the wall surfaces 15 thereof. The resin 21 is used for integrally molding the die pad 4 and the semiconductor element 18 on the die pad 4. The through holes 5 are provided in portions of the die pad 4 near the outside thereof.

The semiconductor device of the present invention is produced by the method described below. Plating, for example, silver plating, is first performed in a portion of the lead frame 1 in the form of an elongated plate on which the bonding metal thin films 16 are to be formed, e.g., in the portion corresponding to the region 8 of bonding metal-plating shown in FIG. 1. The lead frame is then processed into the same shape as that shown in FIG. 1 by punching or etching. Therefore, the wall surfaces 15 of the through holes 5 have no metal thin film formed thereon and are thus composed of the material of the die pad 4. The semiconductor element 18 is fixed to the die pad 4 of the thus-produced lead frame 1 by means of a fixing material such as the solder 19. During soldering, the molten solder 19 easily adheres to the metal thin film 16 of the die pad 4 because of good wettability thereof. On the other hand, the wall surfaces 15 of the through holes 5 exhibit poor wettability by the solder 19 because the surfaces 15 have no metal thin film and the iron-based alloy of the material of the die pad 4 is exposed to air. Therefore, the solder does not flow into the through holes 5 to fill them so that spaces where the sealing resin 21 is charged are maintained. Electrode terminals (not shown) of the semiconductor element 18 are then connected to the leads 6 by means of the wires 20. These members are subjected to integral molding using the sealing resin 21. Then, in the same way as in the conventional semiconductor device, the frame pieces 2, the die bars 7 and the support arms 3 are cut and the leads 6 are bent at the portions at which the leads separate from the resin 21, the mounting metal thin film 22 being formed on the surfaces of the portions of the leads outside the resin.

As described above, since the through holes 5 are charged with a large amount of the resin 21, the effect of engagement between the die pad 4 and the resin 21 is produced and disperses stress. It is also possible to prevent cracks from occurring in the resin due to the stress produced by temperature changes.

Although, in the above-described embodiment, the material of the die pad 4, i.e., the material of the lead frame, is an iron-based alloy, use of a copper-based alloy exhibits the same effect.

What is claimed is:

1. A packaged semiconductor device comprising:
    a die pad having a main surface and through holes having walls that extend to said main surface;
    a metal film having a composition different from that of said die pad disposed on said main surface but not on said walls;
    a semiconductor element mounted on said metal film with a fixing material that wets said die pad relatively poorly and that wets said metal film relatively well; and a resin encapsulating said die pad and semiconductor element and disposed in said holes.

2. The packaged semiconductor device of claim 1 wherein said through holes are disposed proximate the periphery of a semiconductor mounting portion of said die pad.

3. The packaged semiconductor device of claim 1 wherein said pad is an iron-based alloy, said metal film is silver, and the fixing material is a solder.

* * * * *